(12) United States Patent
Bhatia

(10) Patent No.: US 9,312,837 B2
(45) Date of Patent: Apr. 12, 2016

(54) DYNAMIC MARGIN TUNING FOR CONTROLLING CUSTOM CIRCUITS AND MEMORIES

(71) Applicant: Apple Inc., Cupertino, CA (US)

(72) Inventor: Ajay Kumar Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/451,721

(22) Filed: Aug. 5, 2014

(65) Prior Publication Data

US 2016/0043707 A1 Feb. 11, 2016

(51) Int. Cl.
*H03H 11/26* (2006.01)
*H03K 5/13* (2014.01)
*G01R 31/40* (2014.01)
*G01R 19/00* (2006.01)
*H03K 5/00* (2006.01)

(52) U.S. Cl.
CPC .............. *H03K 5/13* (2013.01); *G01R 19/0084* (2013.01); *G01R 31/40* (2013.01); *H03K 2005/00019* (2013.01)

(58) Field of Classification Search
USPC .................................. 327/261–262, 276–278
See application file for complete search history.

(56) References Cited

U.S. PATENT DOCUMENTS

| 6,356,158 | B1 * | 3/2002 | Lesea ..................... H03L 7/087 327/156 |
| 7,893,739 | B1 * | 2/2011 | Nagarajan ............... H03K 5/133 327/149 |
| 8,228,106 | B2 * | 7/2012 | Baumann ............... H03K 5/135 327/278 |
| 8,531,225 | B1 | 9/2013 | Hussain |
| 2010/0090730 | A1 | 4/2010 | Wu |
| 2012/0182057 | A1 | 7/2012 | Ma |
| 2013/0285717 | A1 | 10/2013 | Xiao et al. |
| 2013/0311792 | A1 | 11/2013 | Ponnathota et al. |

FOREIGN PATENT DOCUMENTS

EP          1306740          5/2003

OTHER PUBLICATIONS

Partial Search Report in application No. PCT/US2015/041496 issued Nov. 12, 2015.

* cited by examiner

*Primary Examiner* — An Luu
(74) *Attorney, Agent, or Firm* — Meyertons, Hood, Kivlin, Kowert & Goetzel, P.C.

(57) ABSTRACT

Embodiments of a method that may allow for selectively tuning a delay of individual logic paths within a custom circuit or memory are disclosed. Circuitry may be configured to monitor a voltage level of a power supply coupled to the custom circuit or memory. A delay amount of a delay unit within the custom circuit or memory may be changed in response to a determination that the voltage level of the power supply has changed.

18 Claims, 6 Drawing Sheets

DYNAMIC MARGIN TUNING FOR CONTROLLING CUSTOM CIRCUITS AND MEMORIES

BACKGROUND

1. Technical Field

Embodiments described herein relate to integrated circuits, and more particularly, to techniques for tuning circuits paths within integrated circuits.

2. Description of the Related Art

Processors, memories, and other types of integrated circuits, typically include a number of logic circuits composed of interconnected transistors fabricated on a semiconductor substrate. Such logic circuits may be constructed according to a number of different circuit design styles. For example, combinatorial logic may be implemented via a collection of un-clocked static complementary metal-oxide semiconductor (CMOS) gates situated between clocked state elements such as flip-flops or latches. Alternatively, depending on design requirements, some combinatorial logic functions may be implemented using clocked dynamic logic, such as domino logic gates.

Wires formed from metallization layers available on a semiconductor manufacturing process may be used to connect the various clocked state elements and logic gates. Manufacturing variation from chip to chip as well as differences in physical routing of the wires may result in different propagation times between logic gates.

During operation, voltage levels of various on-chip power supplies may vary. Such variation may be the result of voltage drops across parasitic circuit elements during increased levels of activity of logic switching. In some cases, variation in power supply voltage levels may be the result of changes in an operation mode of a chip, mobile device, etc. During periods of decreased activity, power supply voltage levels may be lowered since slower circuit performance is acceptable.

SUMMARY OF THE EMBODIMENTS

Various embodiments of a method and apparatus for tuning delay in a circuit path are disclosed. Broadly speaking, an apparatus and a method are contemplated in which, a functional unit includes a plurality of circuit paths, where each circuit path includes at least one delay unit. Circuitry may be configured to monitor a voltage level of a power supply coupled to the functional unit and, in response to a detection of a change in the voltage level of the power supply, adjust the delay amount of a delay unit of a given circuit path.

In one embodiment, the circuitry is further configured to pause operation of the functional block in response to the detection of the change in the voltage level of the power supply.

In a further embodiment, the circuitry may be further configured to, in response to completing the adjustment of the delay amount of the delay unit, resume operation of the functional block.

BRIEF DESCRIPTION OF THE DRAWINGS

The following detailed description makes reference to the accompanying drawings, which are now briefly described.

Figure 1:
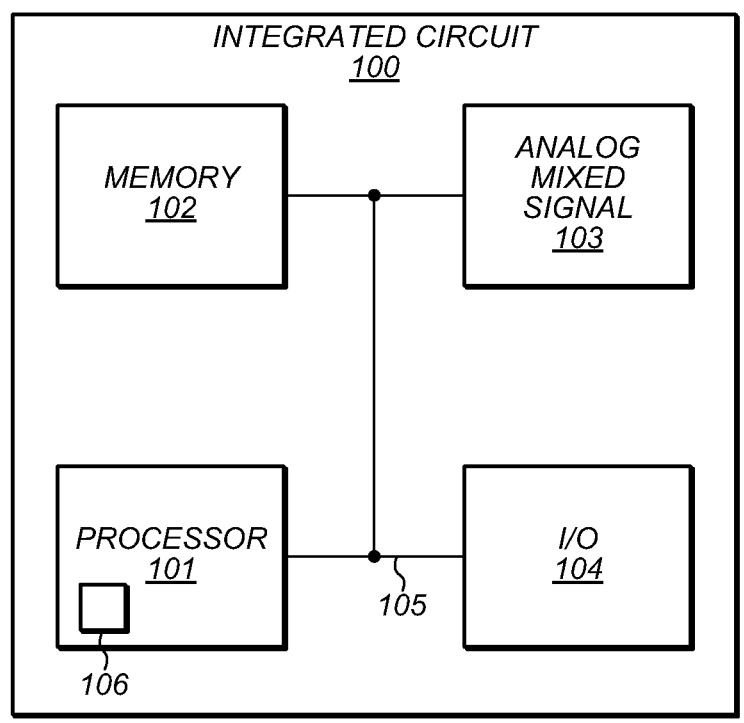
FIG. 1 illustrates an embodiment of an integrated circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

Dynamic voltage scaling, i.e., the adjustment of voltage levels of one or more internal power supplies on a system-on-a-chip (SoC), may be employed to reduce dynamic and leakage power within a mobile device. Periods of reduced activity for portions of a SoC may be detected and a voltage level of a corresponding power supplies for the identified portions may be reduced. A frequency of a clock signal provided to the identified portions may also be decreased as well. Such adjustments to power supply voltage levels and clock signal frequencies may allow for reduced power consumption.

Individual functional blocks within an SoC, such as, e.g., a processor or memory, may include multiple circuit paths (both clock and data paths) each of which may include multiple logic gates. As power supply voltage levels are changed in response to the dynamic voltage scaling, timing relationships between signals included in different circuits paths may change. In some cases, such a change in the timing relationship between signals may result in a functional failure within the SoC. For example, if a data path is delayed relative to an associated clock path, the data may fail to arrive at a flip-flop or latch circuit with sufficient setup time, resulting in the flip-flop or latch circuit capturing incorrect data. The embodiments illustrated in the drawings and described below may provide techniques adding or subtracting delay within circuit paths to maintain adequate timing margin across a range of power supply voltage levels.

System-on-a-Chip Overview

A block diagram of an integrated circuit is illustrated in FIG. 1. In the illustrated embodiment, the integrated circuit 100 includes a processor 101 coupled to memory block 102, and analog/mixed-signal block 103, and I/O block 104 through internal bus 105. In various embodiments, integrated circuit 100 may be configured for use in a desktop computer, server, or in a mobile computing application such as, e.g., a tablet or laptop computer.

As described below in more detail, processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processing device 101 may include one or more delay units 106, which may be configured to assist in tuning one or more logic paths by providing variable delay, for example.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), or a FLASH memory, for example. It is noted that in the embodiment of an integrated circuit illustrated in FIG. 1, a single memory block is depicted. In other embodiments, any suitable number of memory blocks may be employed.

Analog/mixed-signal block 103 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 103 may be configured to perform power management tasks with the inclusion of on-chip power supplies and voltage regulators. Analog/mixed-signal block 103 may also include, in some embodiments, radio frequency (RF) circuits that may be configured for operation with wireless networks.

I/O block 104 may be configured to coordinate data transfer between integrated circuit 100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol.

I/O block 104 may also be configured to coordinate data transfer between integrated circuit 100 and one or more devices (e.g., other computer systems or integrated circuits) coupled to integrated circuit 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

It is noted that the embodiment depicted in FIG. 1 is merely an example. In other embodiments, different functional blocks and different configurations of functional blocks are possible and contemplated.

Logic Paths and Delay Units

Figure 2:
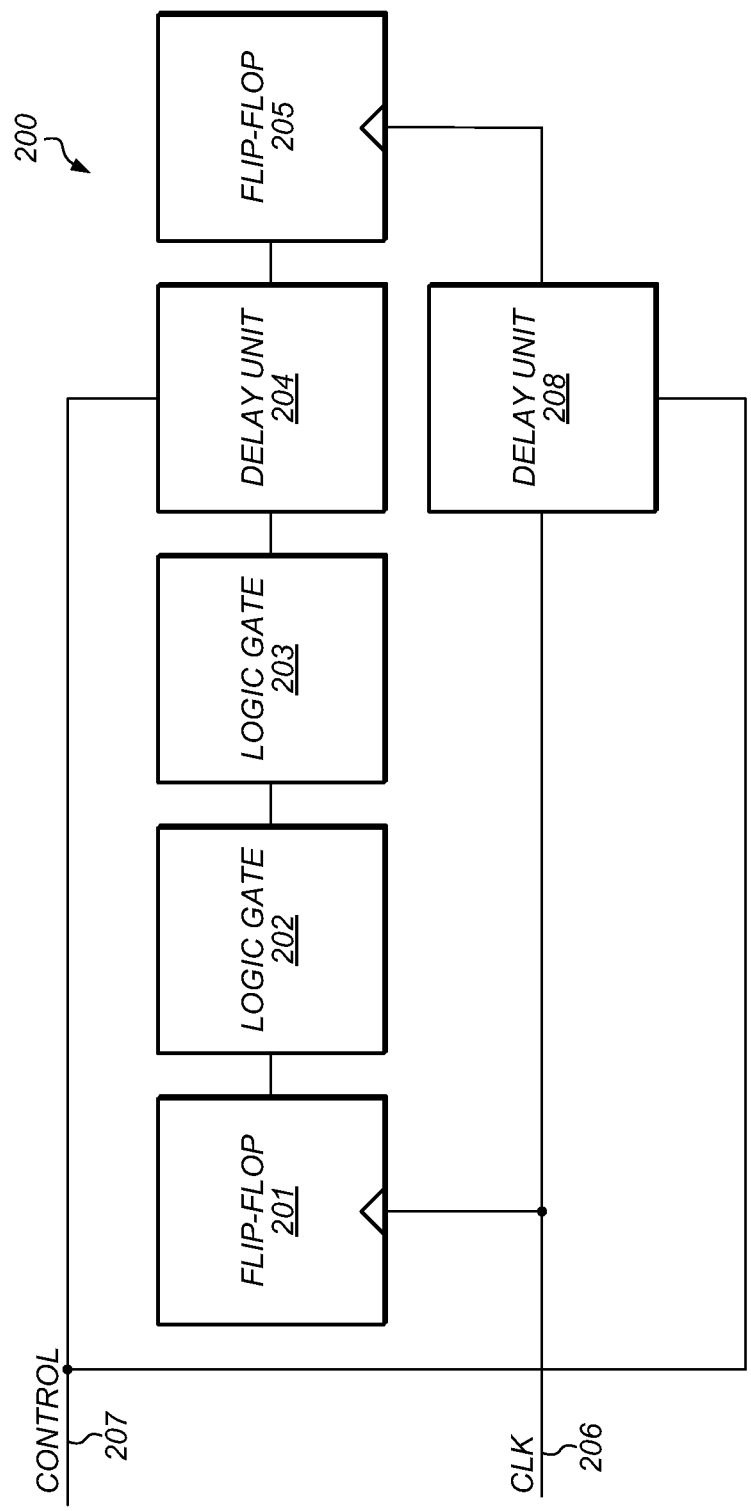
FIG. 2 illustrates an embodiment of a logic path.

An example of a portion of a logic path (also referred to herein as a "circuit path") is illustrated in FIG. 2. In the illustrated embodiment, flip-flop 201 is coupled to logic gate 2-2, which is, in turn, coupled to logic gate 203. Logic gate 203 is coupled to delay unit 204, which is, in turn, coupled to another flip-flop 205. The illustrated embodiment also includes a clock signal 206 denoted as "CLK" and control input 207 denoted as "CONTROL." Clock signal 206 is coupled to delay unit 208, whose output is coupled to a clock input of flip-flop 205. Generally speaking, flip-flops 201 and 205 may correspond to any suitable state element, such as a static or dynamic flip-flop. Flip-flops 201 and 205 may operate to capture and store input data in response to clock signal 206. For example, flip-flops 201 and 205 may be an edge-triggered state element.

Logic gates 202 and 203 may be configured to implement combinatorial logic functions of any suitable type (e.g., AND, OR, NAND, NOR, XOR, and XNOR, or any suitable Boolean expression). Either of logic gates 202 or 203 may be implemented using static or dynamic logic. For example, if implemented using dynamic logic, logic gates 202 and 203 may also be clocked by clock input 206, or they may be clocked by another clock signal (not shown) that is derived from clock signal 206. It is noted that the number of logic gates and connectivity shown in FIG. 2 are merely an illustrative example, and that in other embodiments, other numbers and configurations of gates and state elements may be employed.

As described below in more detail, delay unit 204 may be configured to delay propagation of an output from logic gate 203, thereby delaying the arrival of the output of logic gate 203 at the input of 205. Additionally, delay unit 208 may be configured to delay propagation of clock signal 206 from the clock input of flip-flop 201 to the clock input of flip-flop 205. In various embodiments, an adjustment, i.e., an increase or decrease, in the amount of delay provided by delay units 204 and 206 may be possible. Control input 207 may include multiple data bits, the values of which may be decoded, to select one of various possible amounts of delay for each of delay units 204 and 206. In other embodiments, control input 207 may include an analog bias signal, which controls the amount of delay introduced by delay unit 204 into logic path 200 and the amount of delay introduced into the clock signal path of logic path 200.

Flip-flops 201 and 205, logic gates 202 and 203, and delay units 204 and 208 may be coupled using one or more wiring layers available on a semiconductor manufacturing process. Physical properties, such as, e.g., resistivity, may be different for each wiring layer. Furthermore, differences in routing paths, wire widths, and the like, may result in different time constants for the various wire connections between gates as well as different logic paths.

Differences in wiring time constants may generate timing issues, i.e., violations of setup or hold times to flip-flop or latches, when signals from one logic path are passed to another logic path. In such cases, delay amounts for one or more delay units, such as, e.g., delay unit 204 or delay unit 208, may be adjusted to provide adequate timing margin. In some embodiments, the delay amounts may be adjusted in response to changes in voltage level of a power supply coupled to components of a logic path, in order to provide adequate timing margin as the voltage level of the power supply changes.

The logic path illustrated in FIG. 2 may correspond to any of numerous different types of digital logic circuits, and may generally include any series of gates bounded by state elements. In some embodiments, logic path 200 may be part of an address decode path or a data input/output path for a memory. Logic path 200 may, in other embodiments, correspond to a portion of a datapath within a processing device.

The datapath may be a portion of an adder, shifter, multiplier, divider, buffer, register file, other any other type of circuit or functional unit that operates to store or operate on data during the course of instruction execution. The logic path may also correspond to control paths within a processor that generate signals that control the operation of datapath or other elements within the processor. It is noted, however, that other configurations of logic paths are possible and contemplated.

It is noted that the logic path illustrated in FIG. 2 is merely an example. In various embodiments, different numbers of logic gates, inputs from other logic paths, and additional outputs to different logic paths may be employed.

Figure 3:
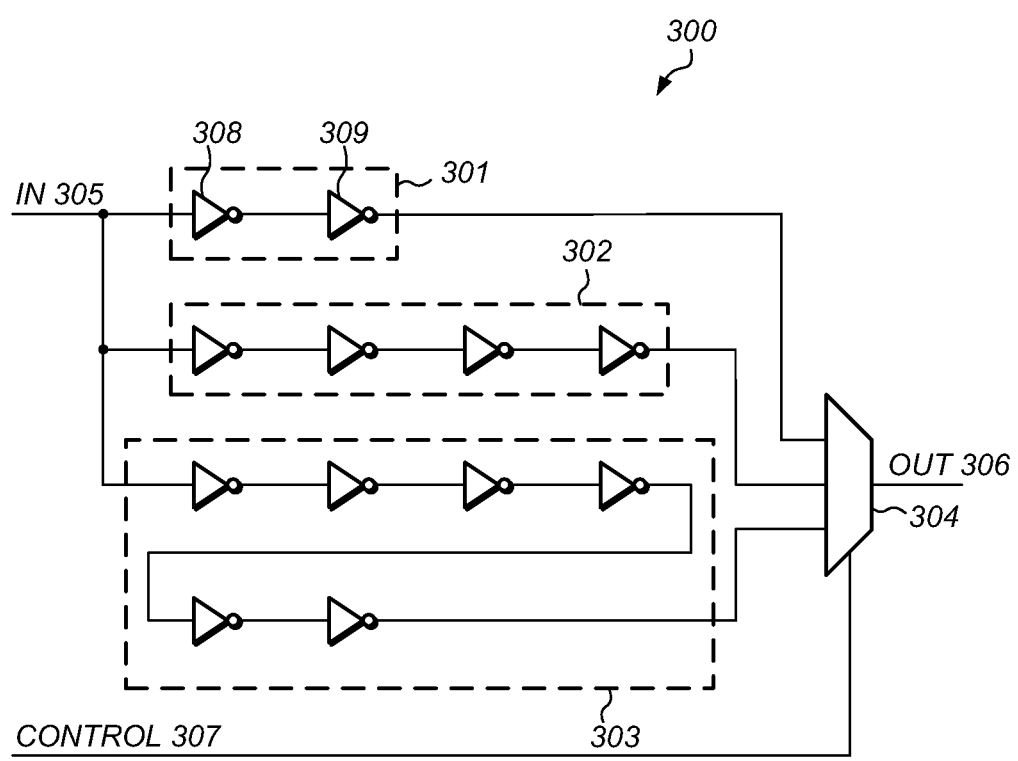
FIG. 3 illustrates an embodiment of a delay unit.

Turning to FIG. 3, an embodiment of a delay unit is illustrated. Delay unit 300 may, in various embodiments, correspond to either of delay unit 204 or delay unit 208 as illustrated in FIG. 2. In the illustrated embodiment, delay unit 300 includes delay circuits 301 through 303, multiplex circuit 304. The illustrated embodiment also includes input signal 305 denoted as "INPUT," control signals 307 denoted as "CONTROL," and output signal 306 denoted as "OUTPUT."

Each of delay circuits 301 through 303 includes multiple inverters. For example, delay circuit 301 includes inverters 308 and 309, each of which contribute a gate delay, i.e., the delay required for a signal to propagate from the input of gate to an output of gate, to the overall delay through the delay circuit 301. With each of delay circuits 301 through 303 including a different number of inverters, each delay circuit has a different intrinsic delay amount, which may be selected by multiplex circuit 304 dependent upon control signal 307. Although inverters are shown in the embodiment illustrated in FIG. 3, in other embodiments, any suitable logic gate may be employed. Moreover, additional devices, such as, e.g., p-channel and/or n-channel MOSFETs, may be employed to maintain a fixed load on the output of each gate within a delay circuit, thereby providing consistent rise and fall times as signals transition.

It is noted that static complementary metal-oxide-semiconductor (CMOS) inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS.

An input of each delay circuits 301 through 303 is coupled to input signal 305, and an output of each of delay circuits 301 through 303 is coupled to respective inputs of multiplex circuit 304. During operation, control signal 307 may be set so as to an output of each of delay circuits 301 through 303 may be selected by multiplex circuit 304. As input signal 305 transitions, the transition propagates through each of delay circuits 301 through 304, arriving at the input of multiplex circuit 304 after different respective periods of time. The selected output may then be propagated to output through 306. In various embodiments, by selecting an output from various delay circuits, a delay unit may provide different delay amounts dependent upon a control signal, such as control signal 307, for example.

Multiplex circuit 304 may be designed in accordance with numerous design styles. For example, multiplex circuit 304 may include one or more pass gates controlled by control signals 307. The output of each pass gate may be coupled together in a wired-OR fashion. It is noted that a pass gate (also referred to as a "transmission gate") may include an n-channel metal-oxide-semiconductor field-effect transistor (MOSFET) and a p-channel MOSFET connected in parallel. In other embodiments, a single n-channel MOSFET or a single p-channel MOSFET may be used as a pass gate. It is further noted that, in various embodiments, a "transistor" may correspond to one or more transconductance elements such as a junction field-effect transistor (JFET), for example.

The embodiment depicted in FIG. 3 is merely an example. In other embodiments, different numbers of delay circuits may be employed.

Figure 4:
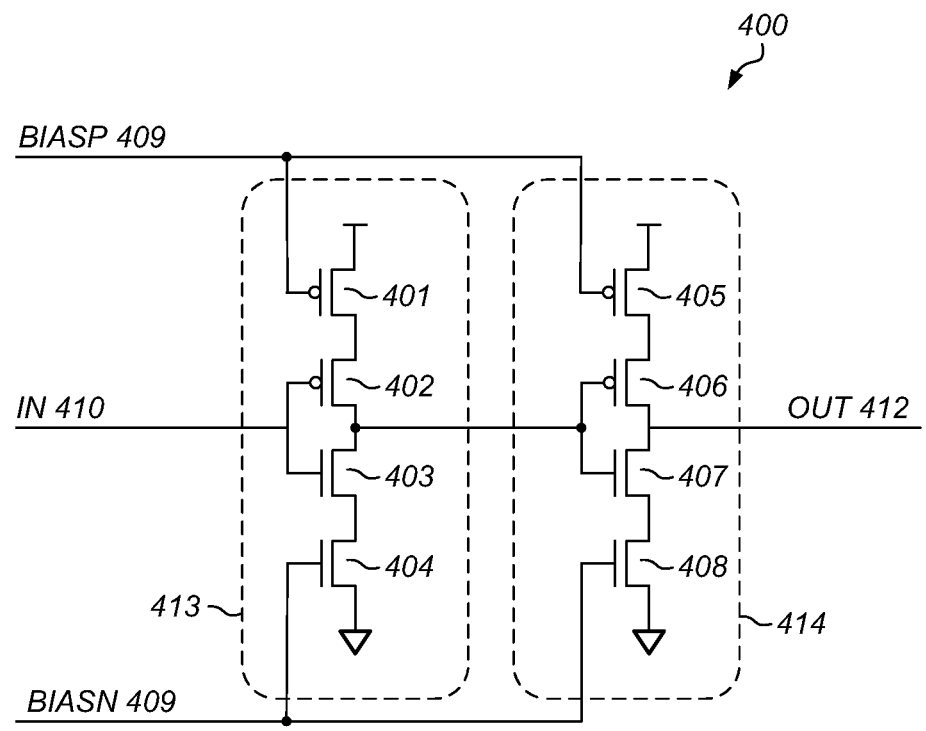
FIG. 4 illustrates another embodiment of a delay unit.

An embodiment of a delay circuit is illustrated in FIG. 4. In the illustrated embodiment, delay circuit 400 includes controlled inverters 413 and 414. The output of controlled inverter 413 is coupled to an input of controlled inverter 414 to form a buffer circuit, i.e., a circuit that does not change the logical state (low or high) of the input signal. Delay circuit 400 further includes p-channel bias signal 409 denoted as "BIASP," data input signal 410 denoted as "IN," n-channel bias signal 411 denoted as "BIASN," and data output signal 412 denoted as "OUT."

It is noted that "low" or "low logic level" refers to a voltage at or near ground and that "high" or "high logic level" refers to a voltage level sufficiently large to turn on a n-channel MOSFET and turn off a p-channel MOSFET. In other embodiments, different technology may result in different voltage levels for "low" and "high."

Controlled inverter 413 includes devices 401 through 404, and controlled inverter 414 includes devices 405 through 408. Data input signal 410 is controls devices 402 and 403, allowing one of them to activate dependent upon the logic state (either high or low) of input signal 410. P-channel bias signal 409 controls device 401, and n-channel bias signal controls device 404. In some embodiments, p-channel bias signal 409 and re-channel bias signal 411 may correspond to control signal 207 as illustrated in FIG. 2.

During operation, p-channel bias signal 409 and n-channel bias signal 411 may be set to a voltage level in order to partially activate (or "turn on") devices 401 and 404, respectively. P-channel bias signal 409 and n-channel bias signal 411 may be set to various analog voltage levels in accordance with various circuit design techniques. For example, a current mirror may be used to mirror a reference current, or a scaled version, thereof, through devices 401 and 404.

By partially activating devices 401 and 404, current sourced to and sunk from controlled inverter 413 is may be restricted, thereby increasing a rise or fall time of the output of controlled inverter 413. An increase the rise or fall time of the output of controlled inverter 413 will increase the time of signal propagation through controlled inverter 413, thereby increasing the delay amount of controlled inverter 413. As with the delay unit illustrated in FIG. 3, delay circuit 400 is capable of multiple delay amounts through the adjustment of the p-channel bias signal 409 and n-channel bias signal 411. Controlled inverter 414 operates in a similar fashion to controlled inverter 413.

It is noted that the embodiment of a delay unit illustrated in FIG. 4 is merely an example. In other embodiments, different devices and different configurations of devices are possible and contemplated.

Figure 5:
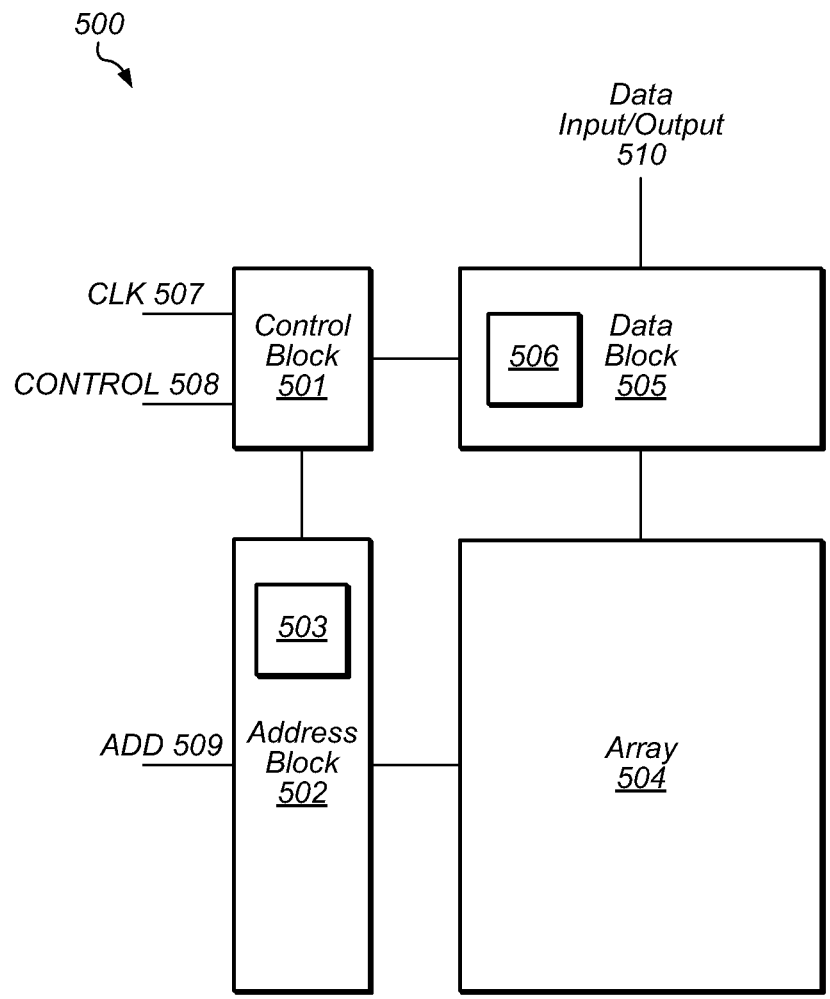
FIG. 5 illustrates an embodiment of a memory.

Turning to FIG. 5, a functional diagram of an embodiment of a memory is illustrated. In the illustrated embodiment, memory 500 includes control block 501, address block 502, array 504, and data block 505. In various embodiments, memory 500 may correspond to memory block 102 of SoC 100 as illustrated in FIG. 1. Memory 500 further includes clock signal 507 denoted as "CLK," address signals 509 denoted as "ADD," and data signals 510 denoted as "DATA." Control block 501 is coupled to address block 502, which is, in turn, coupled to array 504. Control block 501 is further coupled to data block 505, which is also coupled to array 504.

Array 504 may include multiple memory cells arranged in rows and columns. Any suitable type of memory cell may be employed. For example, array 504 may include Static Random Access Memory (SRAM) cells, Dynamic Random Access Memory (DRAM) cells, and the like. In some embodiments, array 504 may be coupled to a dedicated power supply that may be separate from a power supply coupled to control block 501, address block 502, and data block 505. A voltage level of the dedicated power supply coupled to array 504 may, in some embodiments, be less than a voltage level of the power supply coupled to the other blocks.

Control block 501 may include a state machine or state logic, and may be configured to provide timing signals to address block 502 and data block 505 dependent upon the status of the state machine or state logic as well as clock signal 507 and control signals 508. In some embodiments, control block 501 may include a decode circuit to determine the operating mode of memory 500, such as, e.g., a data storage or "write" operation, dependent upon the state of control signals 508. In other embodiments, control block 501 may include multiple circuit paths.

Address block 502 may be configured to provide row selection signals and column selection signals to array 504. In some embodiments, address block 502 may employ a n-to-$2^n$ decoding scheme, where n is the number of bits in the address value encoded on address signals 509, or any suitable decoding scheme, to generate row and column selection signals. Address block 502 may include delay units 503. In various embodiments, different circuit paths within address block 502 may include one or more delay units, and each delay unit may be configurable to provide one of multiple possible delay amounts. By providing multiple delay amounts, undesirable timing differences across a range of power supply operating voltage levels may be remediated.

Data block 505 may be configured to receive data to be stored, i.e., written, into array 504. Moreover, data block 505 may include amplifiers and related circuitry necessary to retrieve data stored in one or more of the memory cells included in array 504. Both the input and output portions of data block 505 may include multiple circuit paths, each of which may include one of delay units 506. It is noted that although only one block delay unit block is depicted in FIG. 5, any suitable number of delay blocks may be employed. As with delay block 503 in address block 502, delay block 506 may be configured to provide one of a plurality of delay amounts.

It is noted the embodiment of a memory depicted in FIG. 5 is merely an example. Different functional blocks and different combinations of functional blocks may be employed in other embodiments.

Figure 6:
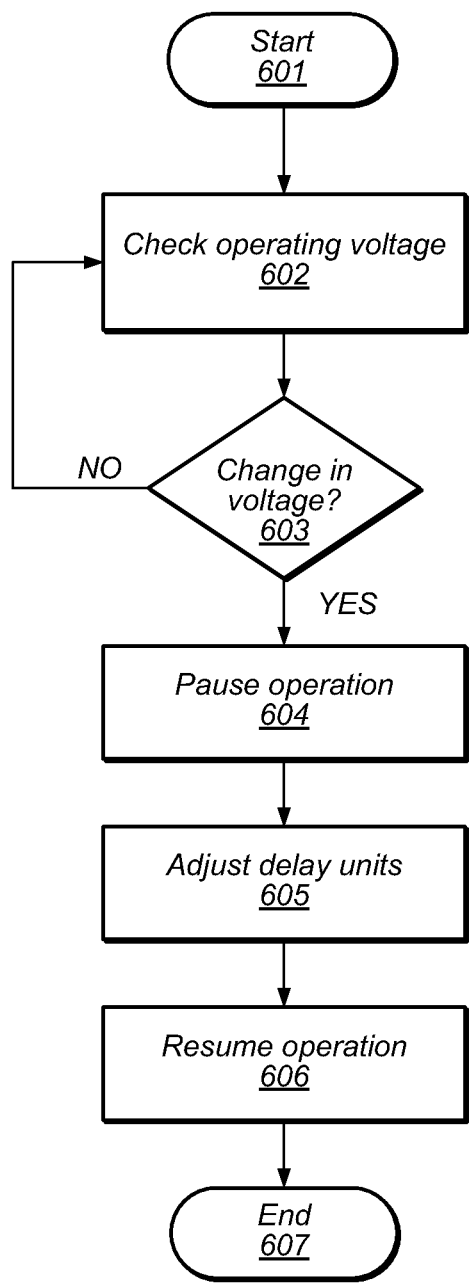
FIG. 6 illustrates a diagram of an embodiment of a method for adjusting a delay unit.

Turning to FIG. 6, a flowchart depicting a method for adjusting a delay unit included in a circuit path of a functional block. The method starts in block 601. A voltage level of a power supply coupled to the functional block may then be checked (block 602). In some embodiments, an analog comparison circuit may be employed to compare the voltage level of the power supply to one or more reference voltages. The power supply may, in various embodiments, be generated internally to a SoC or other integrated circuit, and one or more control signals may be generate to notify other circuits of a change in supply voltage.

The method may then depend on the voltage level of the power supply (block 603). In some embodiments, one or more samples of the voltage level may be tracked over a period of time and the samples compared to a predetermined threshold value to determine the voltage level has changed. The voltage level may either increase or decrease and, in various embodiments, different delay amounts may be selected dependent upon whether the voltage level increased or decreased. The magnitude of the change in the voltage level may also be determined. If no change in the voltage level of the power supply has been detected, the method continues as described above from block 602.

When a change in the voltage level of the power supply has been detected, the operation of the functional unit or block, such as, e.g., memory 500 as illustrated in FIG. 5, may then be paused (block 604). In various embodiments, a clock generated internally to the functional block may be stopped. Alternatively, a clock signal provided to the functional block by an external generation circuit may be gated at the input of the functional block to prevent the clock signal from propagating into the functional block. In some embodiments, by pausing operation of the functional block prior to any adjustments of delay units, a logical state of functional block may be preserved.

Once operation has been paused, delay amounts for one or more delay units in various circuit paths may then be adjusted (block 605). For example, delay amounts in circuit paths within an address decoder of a memory, may be adjusted. The circuit paths may both data and clock paths within the decoder. The adjusted delay amounts may depend if the change in the voltage level of the power supply increases or decreases the voltage level. In other embodiments, the magnitude of the change may also affect how the delay amounts are adjusted. New delay amounts may be stored in fuses or any other suitable non-volatile memory, and selected dependent upon the aforementioned criteria. The stored values may the result of a calibration operation that characterizes circuit performance at various power supply voltage levels. Such a calibration operation may be performed during an initial test of the SoC or integrated circuit.

With the adjustment of the delay amounts complete, operation of the functional block may then be resumed (block 606). As described above, an internally generated clock may be restarted, or an externally generated clock signal may again be allowed to propagate into the functional block. Once the functional block is again operational, the method may conclude in block 607.

The operations depicted in the method illustrated in FIG. 6 are shown as being performed in a sequential manner. In other embodiments, some or all of the steps may be performed in parallel.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a functional unit including a plurality of circuit paths, wherein each circuit path of the plurality of circuit paths includes at least one delay unit; and
   circuitry configured to:
      monitor a voltage level of a power supply;
      adjust a delay amount of the delay unit of a given circuit path of the plurality of circuit paths responsive to a determination that the voltage level of the power supply has changed; and
      pause operation of the functional unit in response to the determination that the voltage level of the power supply has changed.

2. The apparatus of claim 1, wherein to adjust the delay amount of the delay unit of the given circuit path of the plurality of circuit paths, the circuitry is further configured to resume operation of the functional unit response to a determination the delay amount of the delay unit of the given circuit path has been adjusted.

3. The apparatus of claim 1, wherein the delay unit of the given circuit path of the plurality of circuit paths includes at least one buffer circuit, and wherein to adjust the value of the delay unit, the circuitry is further configured to adjust a voltage level of a bias signal coupled to the at least one buffer circuit.

4. The apparatus of claim 1, wherein the delay unit of the given circuit path of the plurality of circuit paths includes a plurality of delay circuits, wherein each delay circuit of the plurality of delay circuits is configured to delay propagation of a signal by a respective time period of a plurality of time periods, and wherein to adjust the value of the delay unit included in the circuit path included in the address decoder, the circuitry is further configured to select an output from a given delay circuit of a plurality of delay circuits.

5. The apparatus of claim 1, wherein to adjust the delay amount of the delay unit in the given circuit path, the circuitry is further configured to increase a period of time for a signal to propagate through the delay unit.

6. A method for operating a functional unit included in an integrated circuit, wherein the functional unit includes a plurality of circuit paths, the method comprising:
monitoring a voltage level of a power supply;
pausing operation of the functional unit responsive to detecting a change in the voltage level of the power supply;
adjusting a delay amount of a delay unit included in a first circuit path of the plurality of circuit paths responsive to determining that the operation of the functional unit has been paused; and
resuming operation of the functional unit responsive to determining the delay amount of the delay unit of the first circuit path of the plurality of circuit paths has been adjusted.

7. The method of claim 6, wherein the delay unit included in the first circuit path of the plurality of circuit paths includes at least one buffer circuit, and wherein to adjust the value of the delay unit comprises adjusting a voltage level of a bias signal coupled to the at least one buffer circuit.

8. The method of claim 6, wherein the delay unit included in the first circuit path of the plurality of circuit paths includes a plurality of delay circuits, wherein each delay circuit of the plurality of delay circuits is configured to delay propagation of a signal by a respective time period of a plurality of time periods, and wherein adjusting the value of the delay unit comprises selecting an output from a given delay circuit of a plurality of delay circuits.

9. The method of claim 6, wherein adjusting the delay amount of the delay unit in the first circuit path of the plurality of circuit paths comprises increasing a period of time for a signal to propagate through the delay unit.

10. The method of claim 6, wherein adjusting the delay amount of the delay unit in the first circuit path of the plurality of circuit paths comprises decreasing a period of time for a signal to propagate through the delay unit.

11. The method of claim 6, further comprising adjusting a delay amount of a delay unit included in a second circuit path of the plurality of circuit paths responsive to determining that the operation of the functional unit has been paused.

12. A system, comprising:
a processor; and
a memory configured to:
monitor a voltage level of a power supply;
pause operation responsive to a detection of a change in the voltage level of the power supply;
adjust a delay amount of a delay unit included in a circuit path included in an address decoder unit of the memory responsive to a determination that the operation has been paused; and
resume operation responsive to a determination that the delay amount of the delay unit included in the circuit path included the address decoder unit has been adjusted.

13. The system of claim 12, wherein the memory is further configured to adjust a delay amount of a delay unit included in a circuit path of a data input/output unit of the memory responsive to the determination that the operation has been paused.

14. The system of claim 12, wherein the delay unit includes a plurality of delay circuits, wherein each delay circuit of the plurality of delay circuits is configured to delay propagation of a signal by a respective time period of a plurality of time periods, and wherein to adjust the value of the delay unit included in the circuit path included in the address decoder, the memory is further configured to select an output from a given delay circuit of a plurality of delay circuits.

15. The system of claim 12, wherein the delay unit includes at least one buffer circuit, and wherein to adjust the value of the delay unit included in the circuit path included in the address decoder, the memory is further configured to adjust a voltage level of a bias signal coupled to the at least one buffer circuit.

16. The system of claim 12, wherein to adjust the value of the delay unit included in the circuit path included in the address decoder, the memory is further configured to decrease a period of time for a signal to propagate through the delay unit.

17. The system of claim 12, wherein to adjust the value of the delay unit included in the circuit path include in the address decoder, the memory is further configured to increase a period of time for a signal to propagate through the delay unit.

18. The system of claim 12, wherein the memory is further configured to receive a clock signal and generate an internal clock signal dependent upon the received clock signal, and wherein to pause operation, the memory is further configured to stop the internal clock signal.

* * * * *